(12) United States Patent
Mullert (10) Patent No.: US 11,924,975 B1
(45) Date of Patent: Mar. 5, 2024

(54) CAM KEY

(71) Applicant: ACACIA COMMUNICATIONS, INC., Maynard, MA (US)

(72) Inventor: Dave Mullert, Norton, MA (US)

(73) Assignee: Acacia Communications, Inc., Maynard, MA (US)

( * ) Notice: Subject to any disclaimer, the term of this patent is extended or adjusted under 35 U.S.C. 154(b) by 540 days.

(21) Appl. No.: 16/135,755

(22) Filed: Sep. 19, 2018

Related U.S. Application Data (60) Provisional application No. 62/561,094, filed on Sep. 20, 2017.

(51) Int. Cl.
| | |
|---|---|
| *B23P 19/00* | (2006.01) |
| *B25B 27/04* | (2006.01) |
| *G06F 1/18* | (2006.01) |
| *H05K 13/04* | (2006.01) |

(52) U.S. Cl.
CPC ......... *H05K 13/0491* (2013.01); *B25B 27/04* (2013.01); *G06F 1/184* (2013.01)

(58) Field of Classification Search
CPC ...... H05K 13/0491; B25B 27/04; G06F 1/184
See application file for complete search history.

(56) References Cited

U.S. PATENT DOCUMENTS

| | | | |
|---|---|---|---|
| 4,348,141 A * | 9/1982 | Dahl | F16B 35/04 |
| | | | 29/407.02 |
| 7,798,757 B2 * | 9/2010 | Kawano | B23P 19/065 |
| | | | 411/408 |
| 2010/0156123 A1 * | 6/2010 | Walker | B25B 27/02 |
| | | | 408/199 |

* cited by examiner

*Primary Examiner* — Paul D Kim
(74) *Attorney, Agent, or Firm* — K&L Gates LLP (57) ABSTRACT

A method and apparatus for removing a daughter board from a mother board.

12 Claims, 13 Drawing Sheets

CAM KEY

RELATED APPLICATIONS

This application claims the benefit of U.S. provisional patent application 62/561,094, titled "CAM KEY," which is incorporated by reference in its entirety for all purposes.

BACKGROUND

Sometimes it is desired to remove a daughter board from a mother board.

BRIEF DESCRIPTION OF THE FIGURES

Various aspects and embodiments of the application will be described with reference to the following example embodiments. It should be appreciated that the figures are not necessarily drawn to scale.

SUMMARY

A method and apparatus for removing a daughter board from a mother board.

DETAILED DESCRIPTION

In certain embodiments, removing a board or circuit board from another board may require a high exertion to mate or demate the boards. In many embodiments, if exertion or force is applied to the board in an incorrect manner, the board itself or connections on the board may be damaged. In other embodiments, to break all the connections between boards at once may require an extremely high level of exertion. In many embodiments, high density connectors today may require high insertion/extraction forces when mating/demating. In certain embodiments, during demating, it may be possible to damage connector contacts due to improper removal, intensified by the high level of force needed to break all connections, many times coupled with very tight spatial constraints. In some embodiments, the current disclosure may enable a key using a helical cam (swept helical inclined plane) that may provide a mechanical advantage when removing a connectorized circuit board. In other embodiments, the current disclosure may enable a key with a helical cam to provide a mechanical advantage to create a force between two closely spaced boards. In certain embodiments, the key may have a bottom insert that is configurable to be inserted into a board to allow rotational movement but not movement across a board. In most embodiments, applying rotational force or torque to a shaft or cross piece connected to a cylindrical portion or shaft with a ramp or exterior thread extending up a portion of the cylindrical portion or shaft may translate the rotation force or torque applied to an upward force on another object when that object is placed above the ramp or exterior thread.

In some embodiments, a key may be inserted into a hole in a host printed circuit board (PCB) or mother board to allow it to rotate but not translate such as moving in a horizontal plane. In many embodiments, as a key is turned, a daughter PCB may be lifted off a motherboard and connectors between the daughter board and mother board may be separated by mechanical advantage. In many embodiments, as used herein daughter board may be used interchangeably with a daughter PCB. In some embodiments, as used herein mother board may be used interchangeably with a mother PCB.

In some embodiments, a cam key may be advantageous to separate a daughter and mother board as the cam key may provide a compact solution, and also may define which way the connectors "zipper" off. In certain embodiments, connectors may want to be separated at a defined angle along their long axis, and by tweaking a key or cam, it may be possible to control the maximum angle at which the connectors separate. In many embodiments herein, cam, cam key, and key may be used interchangeably.

Figure 1A:
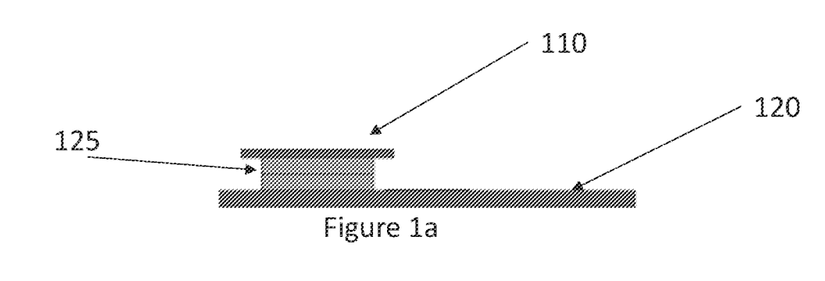
FIG. 1a is a simplified illustration of a daughter board connected to a mother board via a connector, in accordance with an embodiment of the present disclosure.
Figure 1B:
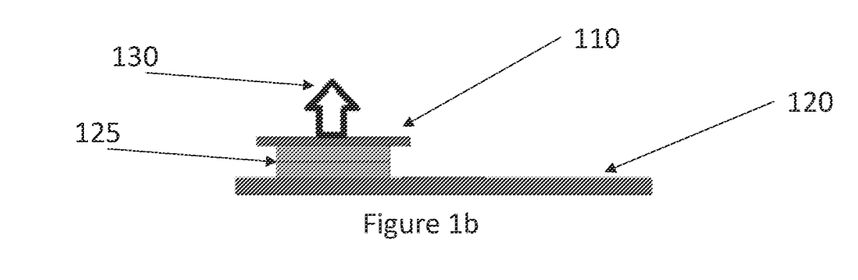
FIG. 1b is a simplified illustration of applying force to separate a daughter board from a mother board, in accordance with an embodiment of the present disclosure.

Refer now to the example embodiment of FIG. 1a, which illustrates a mother board connected to a daughter board. In the example embodiment of FIG. 1a, daughter board 110 is connected to mother board 120 by connectors 125. Connector 125 include pins on daughter board 110 and female receptacles on mother board 120. Refer now to FIG. 1b. In order to separate daughter board 110 from mother board 120, upward force 130 must be applied to daughter board 110 to separate connector 124. In this embodiment, a direct upward force 130 is being applied to separate daughter board 110 from mother board 120. Force 130 may need to be large to separate the pins and may cause damage to either daughter board 110 or mother board 120. In other embodiment, Applicants have recognized that it may be beneficial to utilize a zippering force to remove a daughter board from a mother board, which may lower the amount of force necessary to remove a daughter board from a mother board.

Figure 2A:
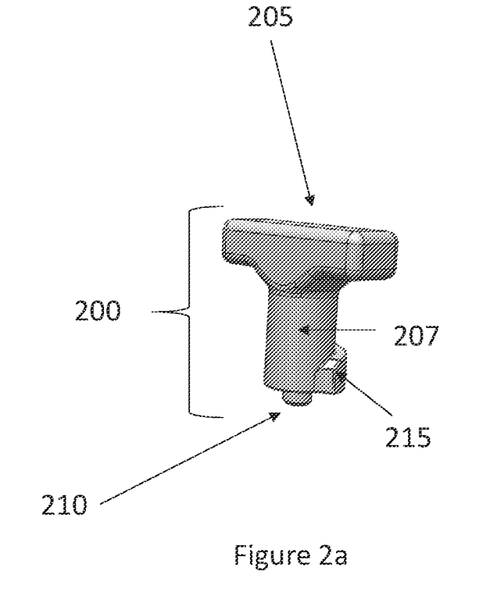
FIG. 2a is a simplified illustration of key having a thread and an insert, in accordance with an embodiment of the present disclosure.
Figure 2B:
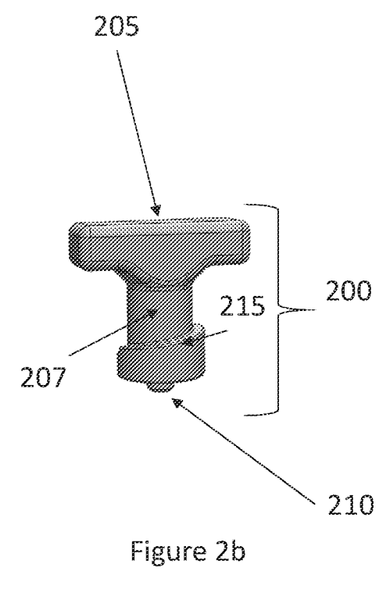
FIG. 2b is an alternative view of a simplified illustration of key having a thread and an insert, in accordance with an embodiment of the present disclosure.

Refer now to the example embodiments of FIGS. 2a and 2b. The example embodiments of FIGS. 2a and 2b illustrate different views a sample key with bottom insert to enable insertion in a hole in a circuit board. In the example embodiment of FIGS. 2a and 2b, key 200 resembles a T type shape. Body 207 of key 200 being a cylindrical shaft or shape crossed at the top by horizontal portion 205 serving as a handle. In these figures, cross bar 205 of the T is across cylindrical shaft 207 and deviates in the middle of the cross into a curve extending to cylindrical shape 207. In many embodiments, crossbar 205 may be used to apply torque or circular force that may be used to turn cylindrical portion 207 or shaft. Screw type exterior groove 215 or exterior thread 215 runs up part of cylindrical shape 207. In these embodiments, exterior groove 215 resembles a partial ramp up cylindrical shape 207. At the middle of the bottom the cylinder 207 or shaft 207, there is insert 210 that may be used to insert key 200 into a hole in a board. In these embodiments, once inert 210 is inserted in a hole of a plane or board, key 200 may be positioned such that the lower portion of exterior groove 215 or ramp sits under a second board or object that is desired to be removed from the plane or board. In these embodiments, by turning key 200, a force is applied to the second board or object. In many embodiments, a force applied to a second board or object using key 200 may remove the second board or object from a first board or plane. In almost all embodiments, a force may cause a portion or side of a daughter board connector to lift or zipper off a mother board.

Figure 3A:
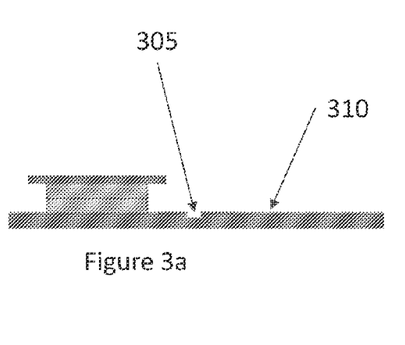
FIG. 3a is a simplified illustration of a cut away of a daughter board connected to a mother board via a connector with a key hole that does not bisect the mother board, in accordance with an embodiment of the present disclosure.
Figure 3B:
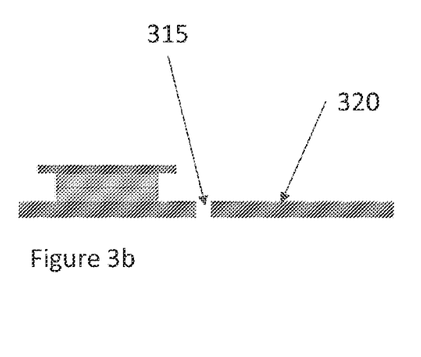
FIG. 3b is a simplified illustration of a cut away of a daughter board connected to a mother board via a connector with a key hole that bisects the mother board, in accordance with an embodiment of the present disclosure.
Figure 3C:
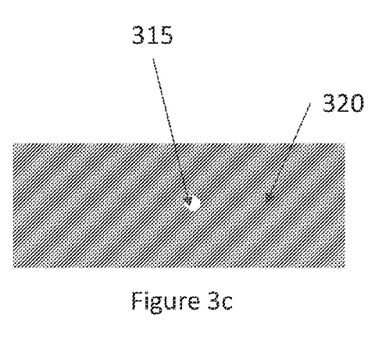
FIG. 3c is a simplified illustration of a to bottom of a motherboard with a key hole that bisects the mother board, in accordance with an embodiment of the present disclosure.

Refer now to the example embodiment of FIG. 3a, which illustrates board 310 with key hole 305 that does not cut through board 310 to enable insertion of a key, into key hole 305. Refer now to the example embodiments of FIGS. 3b and 3c, which illustrate board 320 with key hole 315 that extends through plane 220. FIG. 3b is a cut away view the key hole 315 in board 320 and FIG. 3c is a bottom view of board 320 showing key hole 315.

Figure 4:
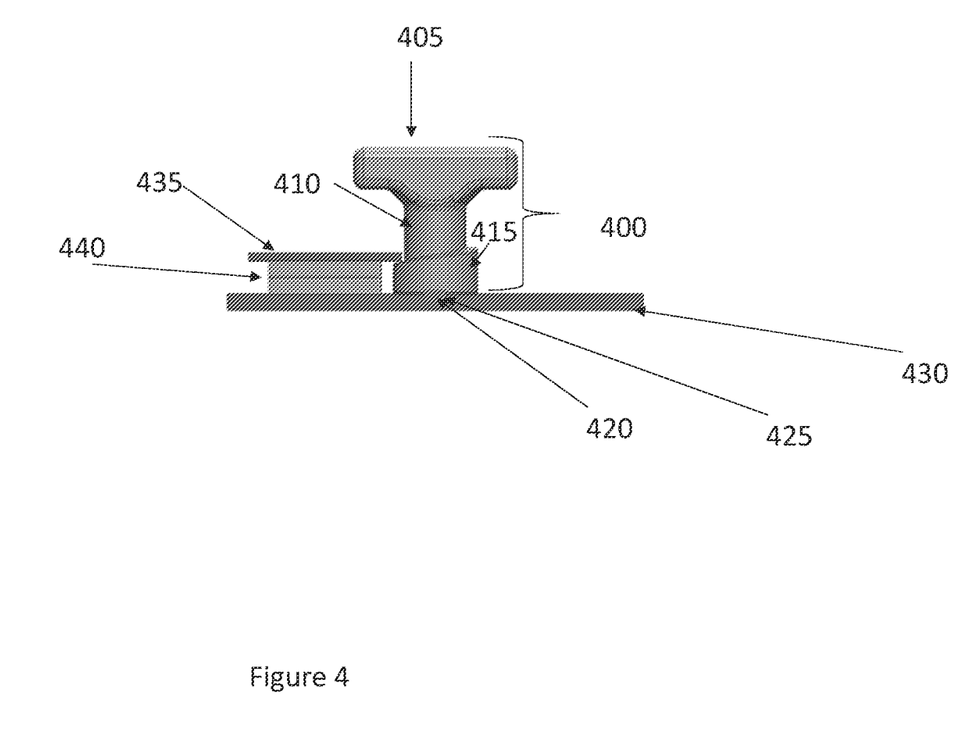
FIG. 4 is a simplified illustration of a key with an insert sitting in a key hole that does not cut through the entire plane, in accordance with an embodiment of the present disclosure.

Refer now to the example embodiment of FIG. 4, which illustrates a key with an insert sitting in a key hole that does not cut through the entire plane. Key 400 has cross bar or handle 405 connected to key body 410, where cylindrical ramp 415 is on the outside of body 410. Key 410 has key insert 420 which is inserted into key hole 425 of mother board 430. Key hole 425 is similar to that of key hole 305 of FIG. 3a. Referring again to FIG. 4, cylindrical ramp 415 of key 405 is positioned under daughter board 435 fitting between daughter board 435 and mother board 430. Connector 440 connected daughter board 435 and mother board 430. Note, FIG. 4 represents a cut away view of a board so that key insert 420 may be seen.

Figure 5:
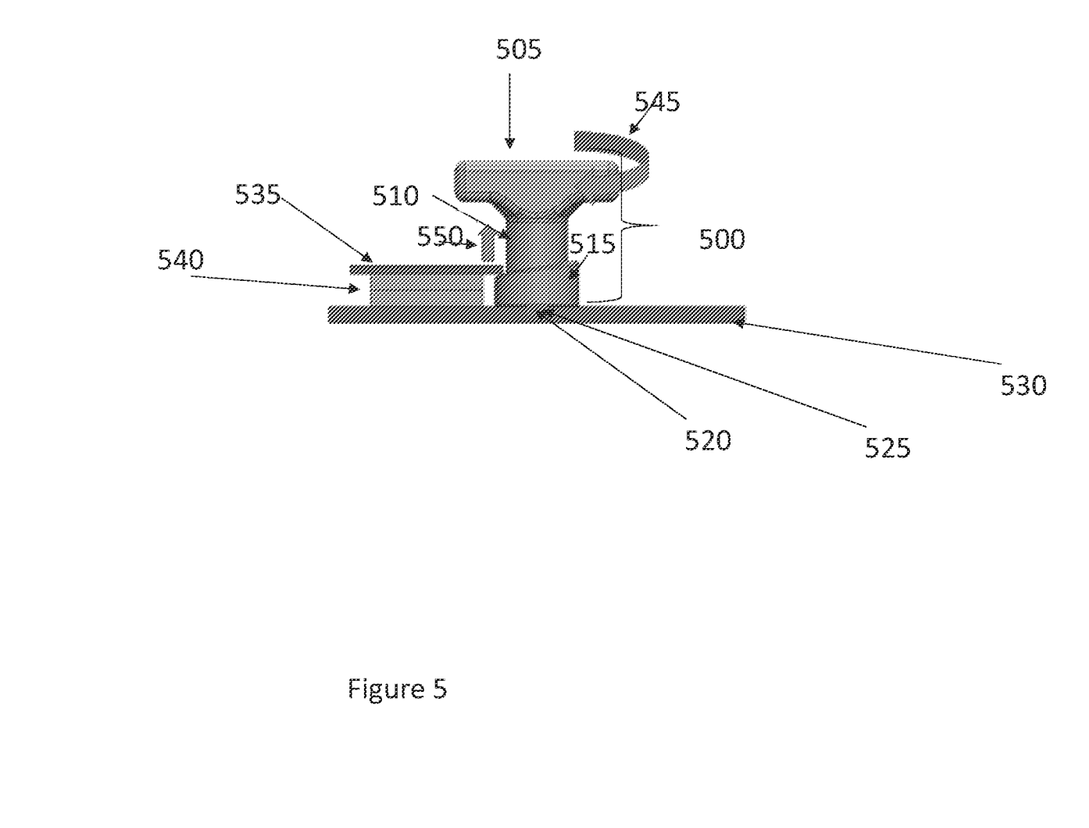
FIG. 5 is a simplified illustration of applying force to a key with an insert sitting in a key hole that does not cut through the entire plane, in accordance with an embodiment of the present disclosure.

Refer now to the example embodiment of FIG. 5, which illustrates how rotational force applied to a key causes vertical force to be applied to a daughter board to separate a connector connecting the daughter board to a mother board. Key 500 has cross bar or handle 505 connected to key body 510, where cylindrical ramp 515 is on the outside of body 510. Key 510 has key insert 520 which is inserted into key hole 525 of mother board 430. Cylindrical ramp 515 of key 505 is positioned under daughter board 535 fitting between daughter board 535 and mother board 530. Connector 540 connected daughter board 535 and mother board 530. As rotational force 545 is applied to key 500, cylindrical ramp 515 turns and the height of cylindrical ramp under daughter board 535 increases. The application of rotational force causes vertical force 550 to be exerted on daughter card 535 by the increasing height of cylindrical ramp 515 between mother board 530 and daughter board 535.

Figure 6:
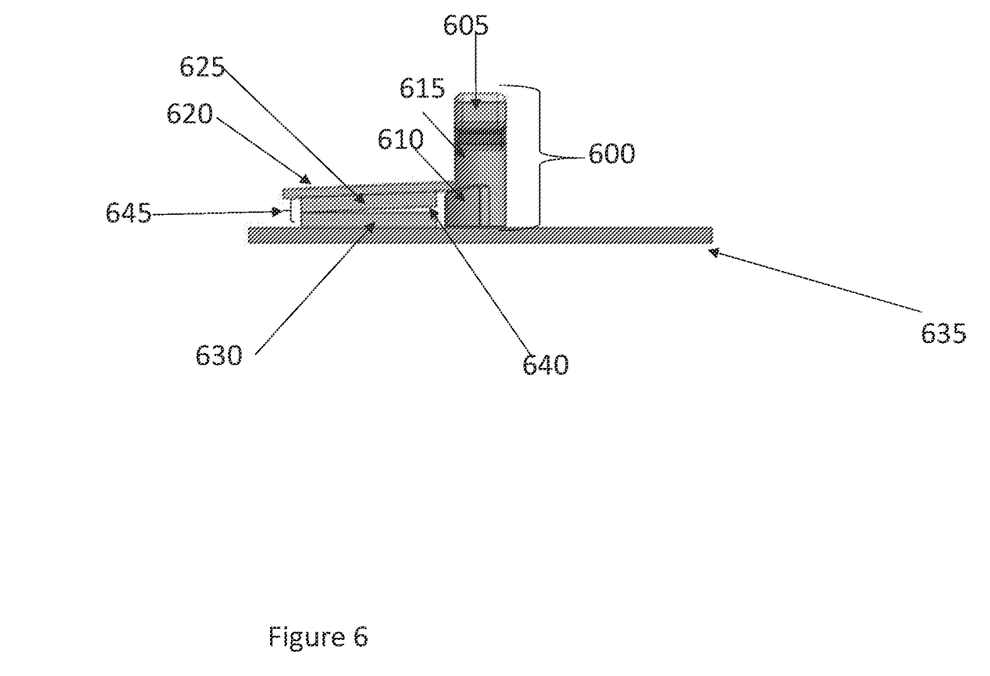
FIG. 6 is a simplified illustration of the key of FIG. 4 that has been rotated 90 degrees to begin to separate a daughter board and a mother board, in accordance with an embodiment of the present disclosure.

Refer now as well to the example embodiment of FIG. 6, which illustrates how a daughter board and mother board have started to separate after application of rotational force to a key caused vertical force to be applied to the daughter board to separate a connector connecting the daughter board to a mother board. Key 600 has been turned 90 degrees clockwise from that of FIG. 5. In FIG. 6, there is a side view of cross bar 605. Cylindrical ramp 610 on the outside of shaft 615 has been turned 90 degrees as key 600 was turned. Cylindrical ramp 610 of key 600, positioned under daughter board 620, has been turned which has forced connector 625 of daughter board 620 and connector 630 of mother board 635 to begin to separate as illustrated by gap 640. As illustrated Connector 645 has begun to separate to connector portion 625 of daughter board 620 and connector portion 630 of mother board 635.

Figure 7:
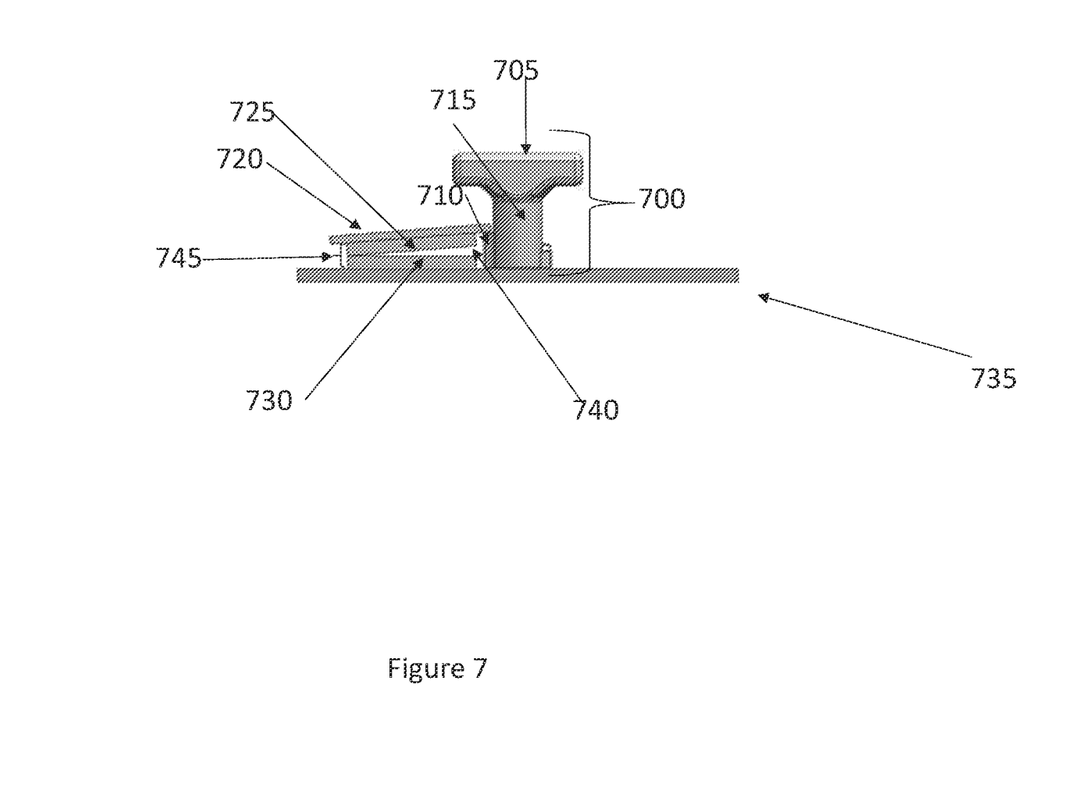
FIG. 7 is a simplified illustration of the key of FIG. 6 that has been rotated 90 degrees to further separate a daughter board and a mother board, in accordance with an embodiment of the present disclosure.

Refer now as well to the example embodiment of FIG. 7, which illustrates how a daughter board and mother board have further separate after application of additional rotational force to a key causing further separation of a connector connecting the daughter board to a mother board. Key 700 has been turned 90 degrees clockwise from that of FIG. 6. In FIG. 7, there is a full view of cross bar 705. Cylindrical ramp 710 on the outside of shaft 715 has been turned 90 degrees as key 700 was turned. Cylindrical ramp 710 of key 700, positioned under daughter board 720, has been turned which has forced connector 725 of daughter board 720 and connector 730 of mother board 635 to further separate as illustrated by gap 740, as compared to gap 640 of FIG. 6. As illustrated, Connector 745 has further separated to connector portion 725 of daughter board 720 and connector portion 730 of mother board 735.

Figure 8A:
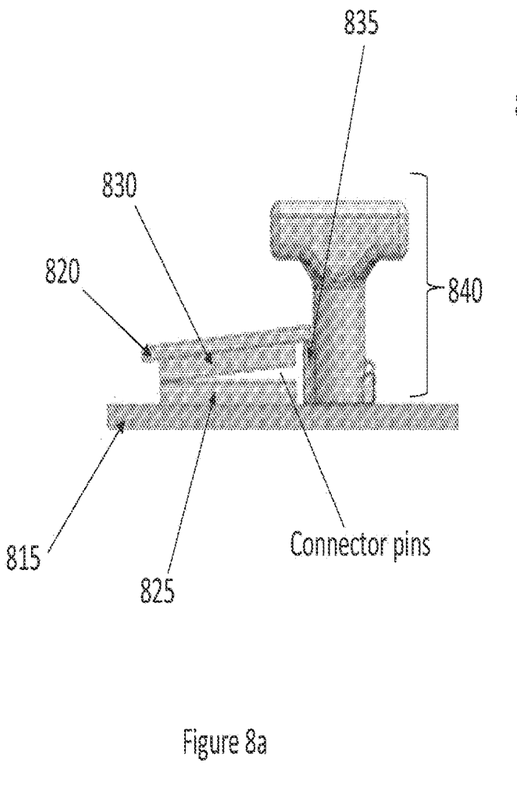
FIG. 8a is a simplified illustration of a key that has been rotated to separate connectors connecting daughter board and a mother board, in accordance with an embodiment of the present disclosure.
Figure 8B:
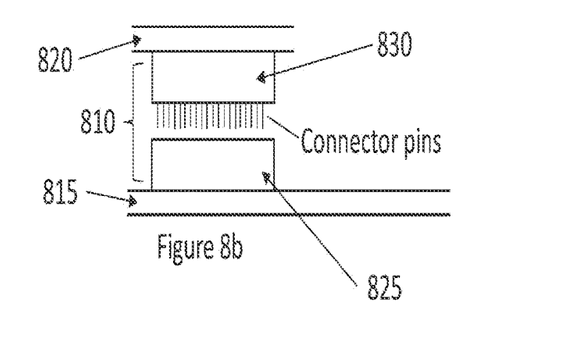
FIG. 8b is a simplified illustration of connectors connecting a daughter board and a mother board, in accordance with an embodiment of the present disclosure.
Figure 8C:
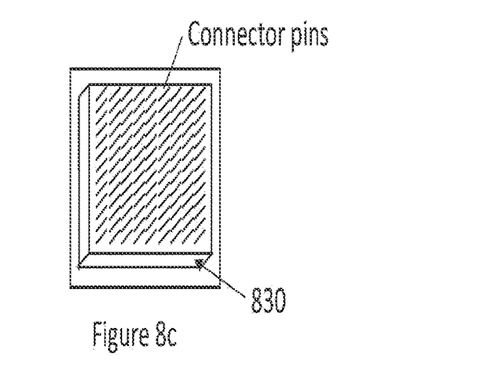
FIG. 8c is a simplified illustration of a top view of pins on connector for a daughter board, in accordance with an embodiment of the present disclosure.

Refer now to the example embodiments of FIGS. 8a, 8b, and 8c, which provide a simplified illustration of connector pins. In FIG. 8b, connection 810 between mother board 815 and daughter board 820 has begun to separate into connector portion 825 of mother board 815 and connector portion 830 of daughter board 820. In FIG. 8a, the connector portions are being separated by cylindrical portion 835 of key 840 in a manner by lifting a portion of the connection closest to key 840 making connector portion 825 and connector portion 830 appear to hinge open. In FIG. 8a, this separation uses less force across connection pins in the connection as only a portion of the pins are separated at a given time. FIG. 8b provides an alternative side view of connector portion 825 and 830 positioned over each other. FIG. 8c presents a slightly offset top view of connector 830 showing its pin distribution.

Figure 9A:
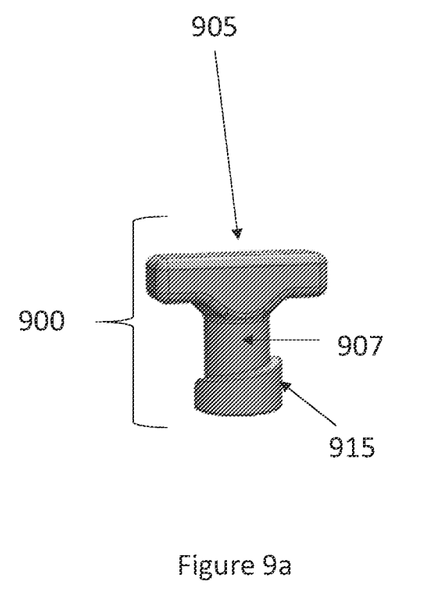
FIG. 9a is a simplified illustration of key have a thread, in accordance with an embodiment of the present disclosure.
Figure 9B:
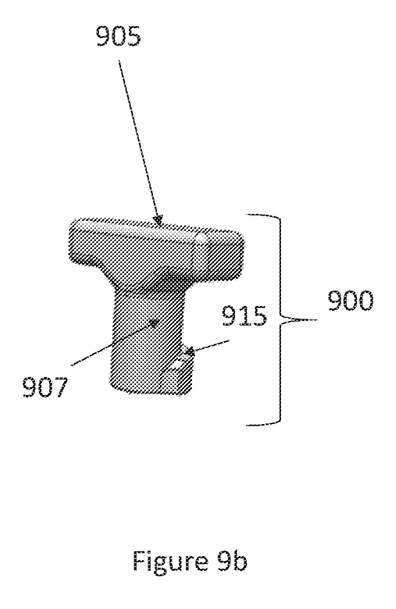
FIG. 9b is an alternative view of a simplified illustration of key have a thread, in accordance with an embodiment of the present disclosure.

Refer now to the example embodiments of FIGS. 9a and 9b. The example embodiments of FIGS. 9a and 9b illustrate different views of a sample key without a bottom insert. In the example embodiment of FIGS. 9a and 9b, key 900 resembles a T type shape body 907 of key 900 being a cylindrical shaft or shape crossed at the top by horizontal portion 905 serving as a handle. In these figures, cross bar 905 of the T is across cylindrical shaft 907 and deviates in the middle of the cross into a curve extending to cylindrical shape 907. In many embodiments, crossbar 905 may be used to apply torque or circular force that may be used to turn cylindrical portion 907 or shaft. Screw type exterior groove 915 or exterior thread 915 runs up part of cylindrical shape 907. In these embodiment, exterior groove 915 resembles a partial ramp up cylindrical shape 907. In these embodiments, by turning key 900, a force is applied to the second board or object. In many embodiments, a force applied to a second board or object using key 920 may remove the second board or object from a first board or plane.

Figure 10A:
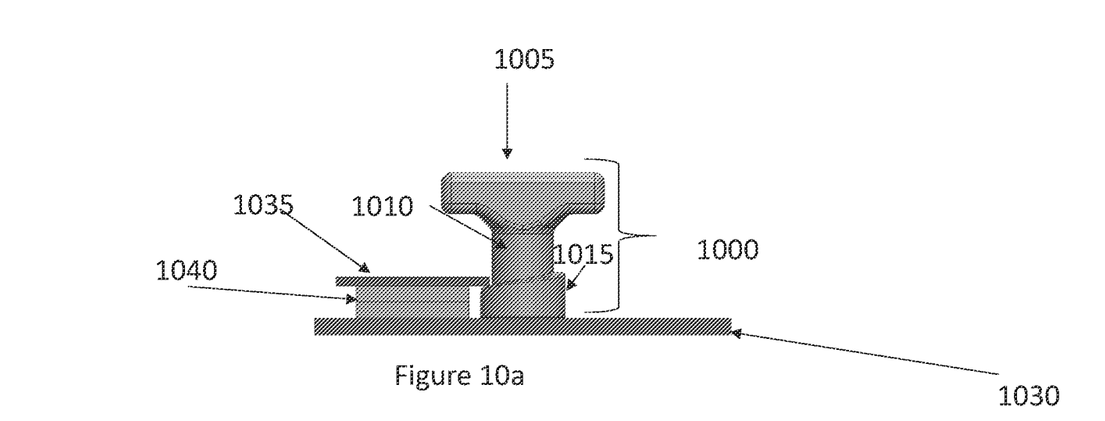
FIG. 10a is a simplified illustration of a key inserted between a mother board and a daughter board, in accordance with an embodiment of the present disclosure.

Refer now to the example embodiment of FIG. 10a, which illustrates a key without an insert. Key 1000 has cross bar or handle 1005 connected to key body 1010, where cylindrical ramp 1015 is on the outside of body 1010. Cylindrical ramp 1015 of key 1000 is positioned under daughter board 1035 fitting between daughter board 1035 and mother board 1030. Connector 1040 connected daughter board 1035 and mother board 1030. Note, FIG. 10a represents a cut away view of a board so that key insert 1020 may be seen.

Figure 10B:
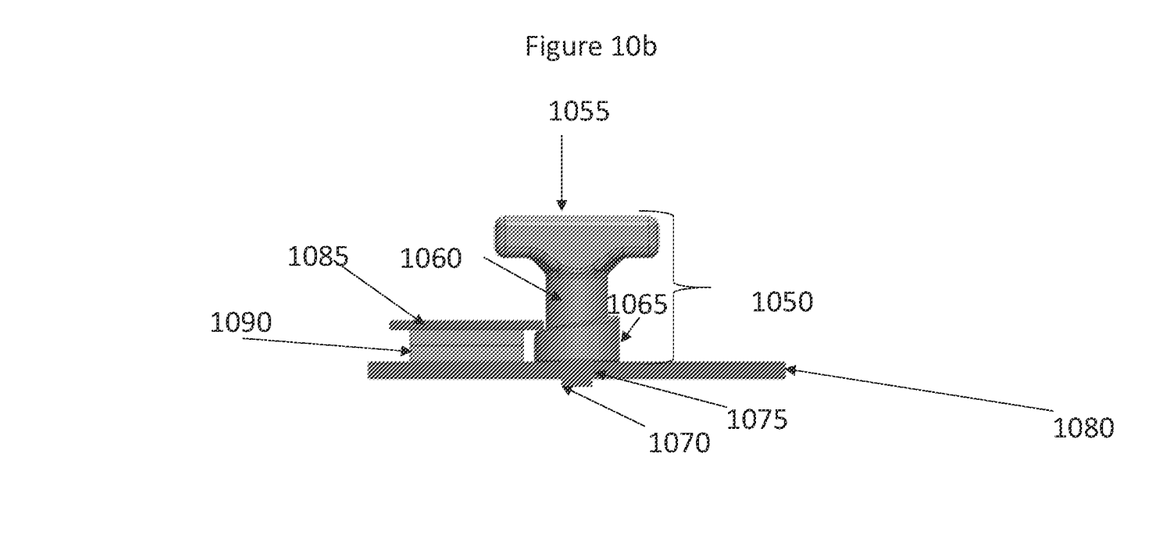
FIG. 10b is a simplified illustration of a key with an insert sitting in a key hole that cuts through the entire plane inserted between a mother board and a daughter board, in accordance with an embodiment of the present disclosure.

Refer now to the example embodiment of FIG. 10b, which illustrates a key with an insert sitting in a key hole that cuts through the entire plane. Key 1050 has cross bar or handle 1055 connected to key body 1060, where cylindrical ramp 1065 is on the outside of body 1060. Key 1050 has key insert 1070 which is inserted into key hole 1075 of mother board 1080. Key hole 1075 is similar to that of key hole 305 of FIG. 3a. Referring again to FIG. 10b, cylindrical ramp 1065 of key 1050 is positioned under daughter board 1085 fitting between daughter board 1085 and mother board 1080. Connector 1090 connected daughter board 1085 and mother board 1080. Note, FIG. 10b represents a cut away view of a board so that key insert 1070 may be seen.

Figure 11A:
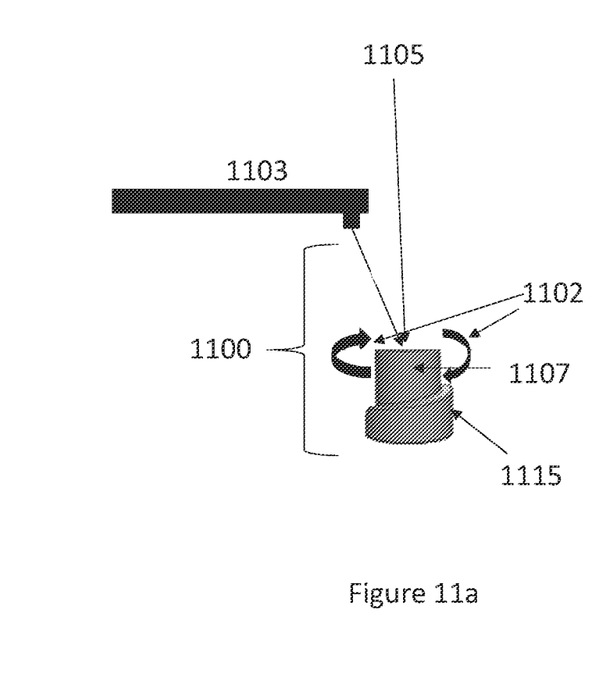
FIG. 11a is a simplified illustration of a key without an insert enabled to receive a device to turn the key, in accordance with an embodiment of the present disclosure.
Figure 11B:
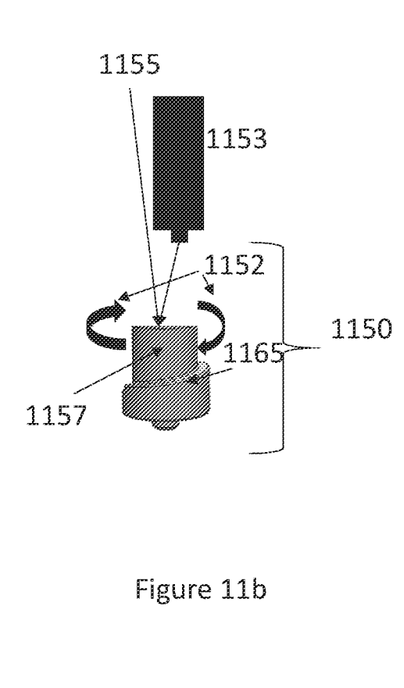
FIG. 11b is a simplified illustration of a key with an insert enabled to receive a device to turn the key, in accordance with an embodiment of the present disclosure.

Refer now to the example embodiments of FIGS. 11a and 11b, which illustrate two different sample keys without a cross bar. In the example embodiments of FIGS. 11a and 11b, Key 1100 in FIG. 11a represents a key in a first view without an insert portion and key 1100 in FIG. 11b represents the key in a second view with an insert portion. In FIG. 11a, Key 1100 has torque 1102 applied to turn key 1100. Key 1100 does not have a cross bar as shown in key 900 of FIG. 9. Rather, torque may be applied key 1100 in many different manners. In the example embodiments of FIG. 11a, lever device 1103 is used to apply torque 1102 to turn key 1100, to change the position of ramp 1115. In certain embodiments, lever device 1103 may be a ratchet. In other embodiments, a lever device may not be a ratchet. In FIG. 11b, Key 1150 has torque 1152 applied to turn key 1150. Key 1150 does not have a cross bar as shown in key 900 of FIG. 9. Rather, torque may be applied key 1150 in many different manners. In the example embodiments of FIG. 11b, torque device 1153 is used to apply torque 1152 to turn key 1150, to change the position of ramp 1165. In certain embodiments, torque device 1153 may be similar to a screw driver. In other embodiments, a torque device may be a device similar to or a drill. In further embodiments, a key may be configured to mate or receive any device configured to apply torque to turn the key.

Figure 12:
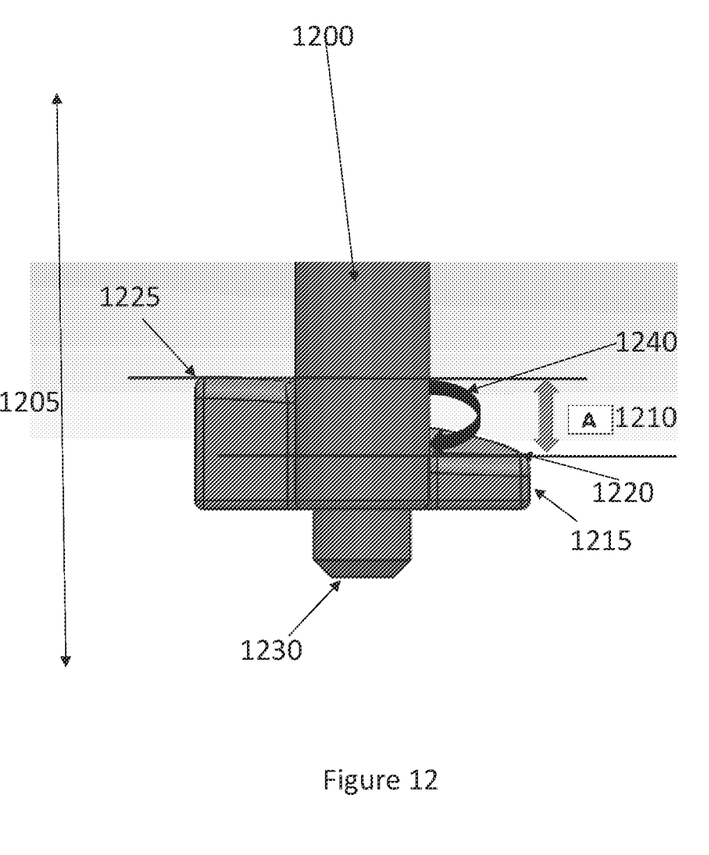
FIG. 12 is a simplified illustration of a key with a thread showing the amount of displacement enabled by the thread, in accordance with an embodiment of the present disclosure.

Refer now to the example embodiment of FIG. 12, which provides an example of how much displacement a key can provide. In the example embodiment of FIG. 12, key 1200 provides a total displacement in Z axis 1205 (up and down) of displacement A 1210. Displacement A 1210 corresponds to the difference of height between top and bottom of ramp 1215. Ramp 1215 has bottom 1220 and top 1225. By subtracting bottom 1220 from top 1225, displacement A 1220 may be calculated. Insert 1230 provides a way to affix key 1200 in the X axis and Y axis when torque 1240 is applied. In other embodiments, displacement of a key may be altered by manipulating an A value or increasing the distance between a vertical distance between a leading edge and the top of a cam key profile. In most embodiments, a bigger "A" value may result in more lift. In most embodiment, and referring to 8a, 8b, and 8c as an example, by modifying the "A" value, it may be possible to control how many pin mates are broken thru the entire revolution of the cam key.

Figure 13:
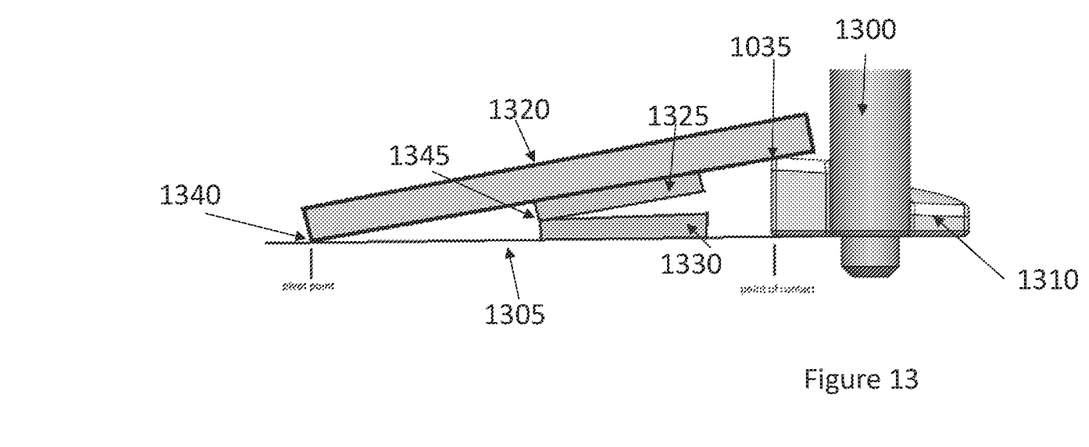
FIG. 13 is a simplified illustration of a key separating mother board and a daughter board using a pivot point and a point of contact, in accordance with an embodiment of the present disclosure.

Refer now to the example embodiment of FIG. 13, which illustrates displacement of connectors using a cam key. In this example embodiment, cam key 1300 has been inserted into mother board 1310. Cam key 1300 turned to the maximum height of thread or ramp 1310. This has caused daughter board 1320 to have its connector portion 1325 separate from connector portion 1330 of mother board. The separation has been caused by ramp 1310 coming in contact with mother board 1320 at point of contact 1035 causing daughter board 1340 to pivot at pivot point 1340. In other embodiments, pivot point may be point 1345 depending on the length of daughter board.

In most embodiments, displacement may be dependent on the length between the contact and pivot points. In many embodiments, an angle created by a cam key may be given by the following equation: Angle=$\sin^{-1}$*("A")/(distance between pivot point and point of contact), where A is the difference in height of the bottom of a ramp of a cam key and a top of a ramp of a cam key. In most embodiments, by knowing this angle the disengagement percentage of the connector may be calculated. In many embodiment, the number of pins to be disengaged by the stroke of a cam key may be calculated based on the difference in height of a ramp of a cam key. In certain embodiments, height difference of a ramp of a cam key may be varied to disengage different percentage of connectors.

In certain embodiments, a key may have a portion that may be inserted into a hole in a board. In most embodiments, the portion inserted into a board may limit movement of the key when rotation force or torque is applied to the key. In certain embodiments, a portion of a key that may be inserted into a hole may reach through the hole in a board. In other embodiments, a portion of a key that may be inserted into a hole may not reach through the hole in the board. In some embodiment, general dimensions of a key may range from 1-4" tall and 0.25-1" in diameter. In many embodiments, a key may be used to detached printed circuit boards from each other. In other embodiments, a key may be used to separate other parts. In most embodiments, a key may be used to separate mated parts. In further embodiments, a key may be used to separate glued parts. In further embodiments, a key may be used to separate magnetically coupled parts. In further embodiments, a key may be used to separate glued parts. Application not necessarily related to PCB's, could be used to separate any press fit parts.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. An apparatus comprising:
   a shaft having a first end and a second end; wherein the shaft is substantially a cylinder; wherein the shaft has a bottom at the first end; wherein an insert is located centrally on the bottom of the first end of the shaft to hold the shaft in position horizontally when the insert is placed in a base; and
   an external ramp positioned on a lower portion of the shaft; wherein a top plane of the external ramp partially spirals between at least a portion of the first end and the second end; wherein the external ramp has a beginning portion located proximate to the first end; wherein the external ramp has an ending portion located closer to the second end than the first end; wherein a second portion of the ending portion is of a height that corresponds to a separation distance between a mother board and a daughter board; wherein the bottom of the external ramp is at a height that enables it to be inserted between the mother board and the daughter board to cause a bottom of the first portion of the ramp to make contact with a top of the mother board and the top plane of the first portion of the ramp to make contact with a bottom portion of the daughter board.

2. The apparatus of claim 1 wherein the apparatus is arranged to enable an application of torque to turn the external ramp by rotating the shaft.

3. The apparatus of claim 2 wherein the separation distance is a minimum distance between a connector of the daughter board which is separated from one or more receptacles of the mother board.

4. The apparatus of claim 2 wherein application of torque rotates the shaft while maintaining its vertical and horizontal position when anchored by the insert and causes the external ramp to articulate upward to separate the mother board and the daughter board.

5. The apparatus of claim 2 wherein a first portion of the beginning portion of the external ramp is sized to fit between the mother board and the daughter board and configured to apply a separating force to separate the mother board and the daughter board.

6. The apparatus of claim 1 further comprising a mating portion for applying torque to the shaft.

7. The apparatus of claim 6, wherein the mating portion is a crosspiece.

8. The apparatus of claim 6, wherein the mating portion enables connection of a ratchet to apply torque.

9. The apparatus of claim 6, wherein the mating portion enables a screwdriver to apply torque to the apparatus.

10. The apparatus of claim 6, wherein the mating portion enables a lever to apply torque to the apparatus.

11. The apparatus of claim 6, wherein the mating portion enables a drill to apply torque to the apparatus.

12. The apparatus of claim 1 wherein the insert is a key portion extruding from the bottom of the shaft arranged such that the key portion, when inserted into a hole, fixes the apparatus across a horizontal plane of the mother board.

* * * * *